United States Patent
Wu

(10) Patent No.: US 7,771,894 B2
(45) Date of Patent: Aug. 10, 2010

(54) PHOTOMASK HAVING SELF-MASKING LAYER AND METHODS OF ETCHING SAME

(75) Inventor: Banqiu Wu, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 824 days.

(21) Appl. No.: 11/532,259

(22) Filed: Sep. 15, 2006

(65) Prior Publication Data

US 2008/0070127 A1   Mar. 20, 2008

(51) Int. Cl.
*G03F 1/00* (2006.01)
(52) U.S. Cl. .............. 430/5; 430/311; 430/394
(58) Field of Classification Search .......... 430/5, 430/311, 394; 216/67; 438/200
See application file for complete search history.

(56) References Cited

U.S. PATENT DOCUMENTS

| | | | |
|---|---|---|---|
| 6,749,974 B2 | 6/2004 | Chan | |
| 2002/0160559 A1* | 10/2002 | Lee et al. | 438/200 |
| 2003/0123605 A1 | 7/2003 | Rau | |
| 2004/0209173 A1* | 10/2004 | Chan | 430/5 |
| 2005/0042523 A1* | 2/2005 | Wu et al. | 430/5 |
| 2005/0238963 A1* | 10/2005 | Ishibashi et al. | 430/5 |
| 2006/0008749 A1* | 1/2006 | Sobel et al. | 430/394 |
| 2006/0051681 A1* | 3/2006 | Taylor | 430/5 |
| 2006/0060565 A9* | 3/2006 | Nallan et al. | 216/67 |

OTHER PUBLICATIONS

Wu, Banqiu, "Thermodynamic study of photomask plasma etching", Oct. 2004.
Wu, Banqiu, et al., "65 nm node photomask etching with zero CD process bias", Nov. 2005.
Wu, Banqiu, "Photomask plasma etching: A review," J. Vac. Sci. Technol. B 24(1), Jan./Feb. 2006, pp. 1-15.

* cited by examiner

*Primary Examiner*—Mark F Huff
*Assistant Examiner*—Rashid Alam
(74) *Attorney, Agent, or Firm*—Moser IP Law Group

(57) ABSTRACT

A photomask structure and method of etching is provided herein. In one embodiment, a photomask includes a translucent substrate and an opaque multi-layer absorber layer disposed over the substrate. The opaque multi-layer absorber layer comprises a self-mask layer disposed over a bulk absorber layer. The self-mask layer comprises one of nitrogenized tantalum and silicon-based materials (TaSiON), tantalum boron oxide-based materials (TaBO), or oxidized and nitrogenized tantalum-based materials (TaON). The bulk absorber layer comprises on of tantalum silicide-based materials (TaSi), nitrogenized tantalum boride-based materials (TaBN), or tantalum nitride-based materials (TaN). The self-mask layer has a low etch rate during the bulk absorber layer etch step, thereby acting as a hard mask.

28 Claims, 3 Drawing Sheets

PHOTOMASK HAVING SELF-MASKING LAYER AND METHODS OF ETCHING SAME

BACKGROUND OF THE INVENTION

1. Field of the Invention

Embodiments of the present invention generally relate photomasks used in the fabrication of semiconductor devices, more specifically, to a photomask having a self-masking layer and methods of etching thereof.

2. Description of the Related Art

In the manufacture of integrated circuits (IC), or chips, patterns representing different layers of the chip are created by a chip designer. A series of reusable photomasks (also referred to herein as masks) are created from these patterns in order to transfer the design of each chip layer onto a semiconductor substrate during the manufacturing process. Mask pattern generation systems use precision lasers or electron beams to image the design of each layer of the chip onto a respective mask. The masks are then used much like photographic negatives to transfer the circuit patterns for each layer onto a semiconductor substrate. These layers are built up using a sequence of processes and translate into the tiny transistors and electrical circuits that comprise each completed chip. Thus, any defects in the mask may be transferred to the chip, potentially adversely affecting performance. Defects that are severe enough may render the mask completely useless. Typically, a set of 15 to 30 masks is used to construct a chip and can be used repeatedly.

A mask generally comprises a transparent substrate having an opaque, light-absorbing layer disposed thereon. Conventionally, the mask is typically a glass or a quartz substrate that has a layer of chromium on one side. The chromium layer is covered with an anti-reflective coating and a photosensitive resist. During a patterning process, the circuit design is written onto the mask by exposing portions of the resist to an electron beam or ultraviolet light, making the exposed portions soluble in a developing solution. The soluble portion of the resist is then removed, allowing the exposed underlying chromium to be etched. The etch process removes the chromium and anti-reflective layers from the mask at locations where the resist was removed, i.e., the exposed chromium is removed.

Key challenges of mask fabrication include etch critical dimension (CD) bias control, etch CD uniformity, cross sectional profiles, etch CD linearity, etch selectivity, and defectivity control. However, with the shrinking of critical dimensions of the mask (corresponding to the shrinking dimensions of the transistors and electrical circuits formed in the ICs), present optical lithography techniques are approaching their technological limit. For example, for current optical binary mask, etch CD bias for a conventional mask under a 65 nm type process is about 15-20 nm on a state-of-art mask etcher. This etch bias issue mainly results from erosion of photoresist. During pattern transfer, the photoresist is consumed significantly because of the limited etch rate selectivity of the absorber layer to the photoresist. This consumption of photoresist lowers the fidelity of the pattern transfer process.

Thus, there is a need for an improved mask and mask fabrication methods.

SUMMARY OF THE INVENTION

A photomask structure and method of etching are provided herein. In one embodiment, a photomask includes a translucent substrate and an opaque multi-layer absorber layer disposed over the substrate. The opaque multi-layer absorber layer comprises a self-mask layer disposed over a bulk absorber layer. The self-mask layer comprises one of nitrogenized tantalum and silicon-based materials (TaSiON), tantalum boron oxide-based materials (TaBO), or oxidized and nitrogenized tantalum-based materials (TaON). The bulk absorber layer comprises on of tantalum silicide-based materials (TaSi), nitrogenized tantalum boride-based materials (TaBN), or tantalum nitride-based materials (TaN). The self-mask layer has a low etch rate during the bulk absorber layer etch step, thereby acting as a hard mask.

In another aspect of the invention, a method of etching a photomask includes providing a photomask comprising a transparent substrate having a multilayer absorber layer disposed thereover, the multilayer absorber layer comprising a self-mask layer disposed over a bulk absorber layer, wherein the self-mask layer comprises tantalum and oxygen and the bulk absorber layer comprises tantalum and no oxygen; etching the self-mask layer using a first etch process; and etching the bulk absorber layer using a second etch process different than the first.

In another embodiment of the invention, a method for creating an image on a blank photomask comprising a photoresist layer, an opaque layer underlying the photoresist layer having anti-reflective sub-layer and bulk sub-layer, and a substantially transparent substrate layer underlying the opaque layer includes creating a patterned image in the photoresist layer; removing portions of the photoresist layer that do not correspond to the patterned image thereby exposing portions of the anti-reflective sub-layer of the opaque layer not corresponding to the patterned image; removing the exposed portions of the anti-reflective sub-layer that do not correspond to the patterned image using a first etch process, thereby exposing portions of the bulk sub-layer not corresponding to the patterned image; removing the exposed portions of the bulk sub-layer underlying the anti-reflective sub-layer that do not correspond to the patterned image using a second etch process having a bulk sub-layer removal rate that is at least 10 time greater than an anti-reflective sub-layer removal rate, thereby exposing portions of the substantially transparent layer that do not correspond to the patterned image; and removing the photoresist layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The images in the drawings are simplified for illustrative purposes and are not depicted to scale.

DETAILED DESCRIPTION

The present invention provides a photomask structure and method of etching that can be used for optical binary photomask, embedded attenuated phase shift mask (EAPSM), and alternate aperture phase shift mask (AAPSM) applications to reduce the etch CD bias and improve pattern transfer fidelity as compared to conventional masks.

Figure 1:
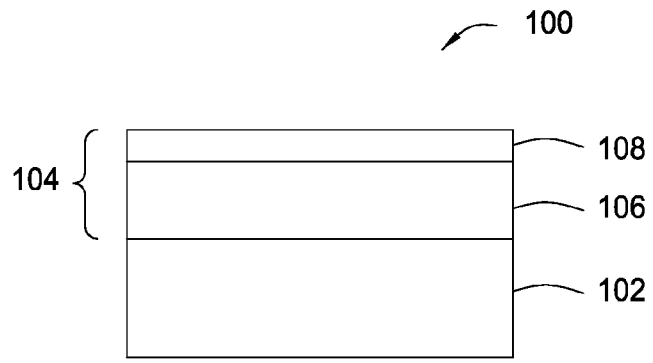
FIG. 1 depicts a mask blank according to one embodiment of the present invention.

FIG. 1 depicts one embodiment of a blank photomask, or mask, 100 of the present invention. As depicted in FIG. 1, the mask 100 includes an optically transparent substrate 102 having a multi-layer absorber layer 104. The substrate 102 may typically comprise an optically transparent silicon based material, such as quartz (e.g., silicon dioxide, $SiO_2$), and the like. The substrate 102 may be any size suitable for use as a photomask. In one embodiment, the substrate 102 has a rectangular shape having sides between about 5-9 inches in length. The substrate 102 may be about 0.15-0.25 inches thick. In one embodiment, the substrate 102 is about 0.25 inches thick The multi-layer absorber layer 104 is an opaque, light-shielding layer and may be between about 40-110 nanometers (nm) thick. The multi-layer absorber layer 104 includes a bulk absorber layer 106 (also referred to as a bulk sub-layer) and a self-mask layer 108 (also referred to as an anti-reflective sub-layer). The bulk absorber layer 106 may be between about 80-85 percent of the thickness of the multi-layer absorber layer 104 (i.e., between about 30-90 nm thick). The bulk absorber layer 106 may comprise tantalum-based materials with essentially no oxygen, such as tantalum silicide-based materials (hereinafter TaSi), nitrogenized tantalum boride-based materials (hereinafter TaBN), and tantalum nitride-based materials (hereinafter TaN).

The self-mask layer 108 may be between about 15-20 percent of the thickness of the multi-layer absorber layer 104 (i.e., between about 10-30 nm thick). The composition of the self-mask layer 108 generally comprises tantalum- and oxygen-based materials. The composition of the self-mask layer 108 corresponds to the composition of the bulk absorber layer 106 and may comprise oxidized and nitrogenized tantalum and silicon-based materials (hereinafter TaSiON) when the bulk absorber layer 106 comprises TaSi; tantalum boron oxide-based materials (hereinafter TaBO) when the bulk absorber layer 106 comprises TaBN; and oxidized and nitrogenized tantalum-based materials (hereinafter TaON) when the bulk absorber layer 106 comprises TaN.

The relation between the composition of the bulk absorber layer 106 and the self-mask layer 108 advantageously provides for reduced defect formation during etching of the mask 100. For example, a first etch process may be utilized to etch the self-mask layer 108 (as described in more detail below), and a second etch process may then be utilized to etch through the bulk absorber layer 106 while maintaining a high etch selectivity of the bulk absorber layer 106 to the self-mask layer 108, thus making the self-mask layer 108 function as hard mask, i.e., a "self-mask," thereby allowing for use of a thinner photoresist layer. This material combination and multi-step etch process advantageously provides lower etch CD bias and better CD uniformity than etching processes utilizing conventional, "soft" photoresist materials.

The process for creating a finished mask, having improved critical dimensions and uniformity, from blank mask 100 is described below with reference to FIGS. 2-3. FIGS. 2A-C depict one embodiment of a fabrication sequence for etching the mask 100 utilizing one embodiment of the method of the present invention. FIG. 3 depicts a flow diagram of one embodiment of a method 300 for etching the mask of FIG. 1, and is described with reference to FIGS. 2A-C. The method 300 may be performed in a TETRA™ I, TETRA™ II, or DPS® II etch chamber available from Applied Materials, Inc. of Santa Clara, Calif., or other suitable etch chamber, as described below with respect to FIG. 4. The method 300 may be stored in a computer readable form in the memory of a controller or other storage medium of the chamber.

Figure 2A:
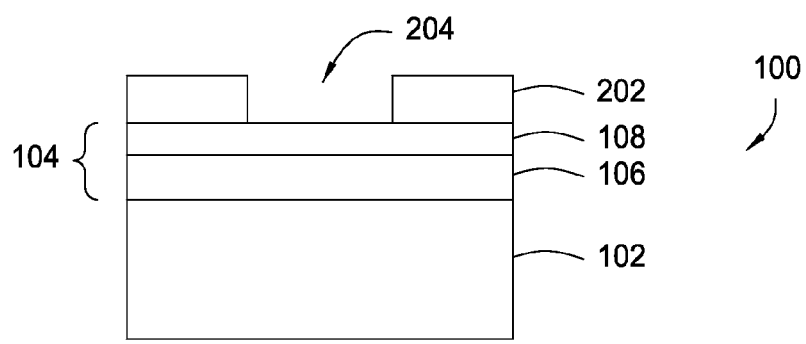
FIGS. 2A-C depict one embodiment of a fabrication sequence for a mask utilizing one embodiment of the method of the present invention.
Figure 3:
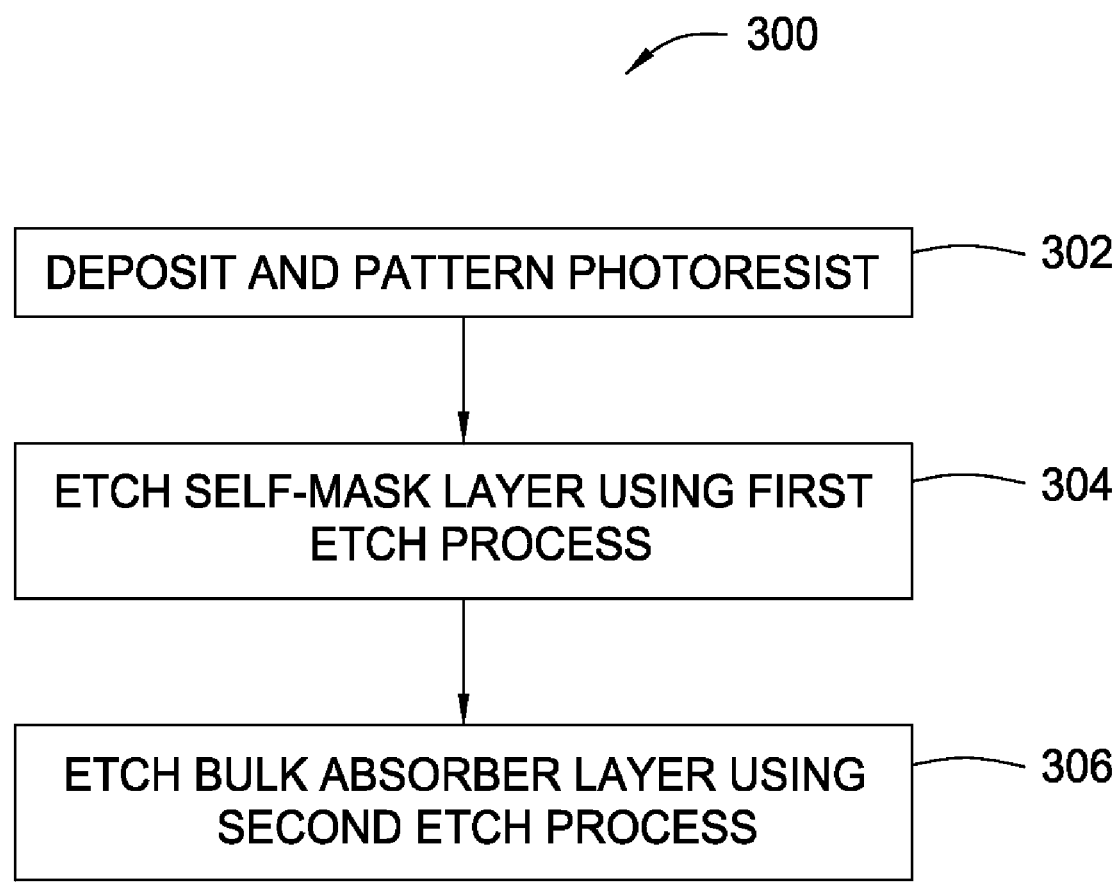
FIG. 3 depicts a flow diagram of one embodiment of a method for etching the mask of FIG. 1.

The method 300 begins at step 302 where a photoresist layer 202 is deposited atop the self-mask layer 108 and is patterned to form an opening 204 corresponding to the design to be transferred to the mask 100 (as depicted in FIG. 2A), thereby exposing corresponding portions of the self-mask layer 108. The photoresist layer 202 comprises any suitable photosensitive resist material and may be deposited and patterned in any suitable manner. The photoresist layer 202 may be deposited to a thickness of between about 100-1000 nm.

Figure 2B:
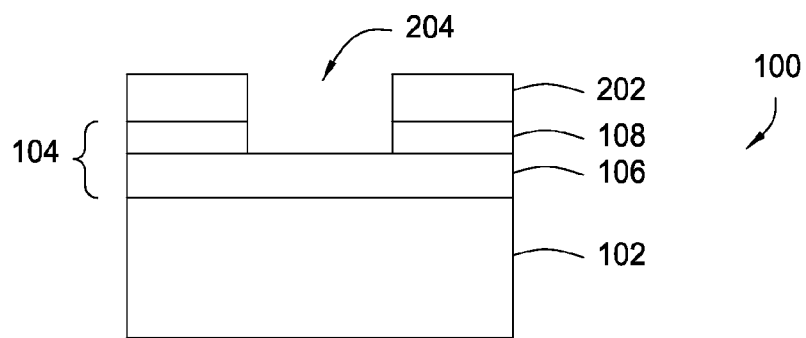

Next, at step 304, the self-mask layer 108 is etched in a first etch process using the photoresist layer 202 as a mask, thereby transferring the pattern of the opening 204 to the self-mask layer 108 (as depicted in FIG. 2B), and thereby exposing corresponding portions of the bulk absorber layer 106. In an embodiment where the self-mask layer 108 comprises TaSiON, the etch selectivity for the self-mask layer 108 over the resist during the first etch process is about 3.8 and the etch selectivity for the self-mask layer 108 over the bulk absorber layer 106 is greater than 8.

The first etch process etches the self-mask layer 108 by exposing the layer (through the opening 204) to species from a first process gas (or gas mixture) comprising at least one of a fluorine-containing gas, carbon tetrachloride ($CCl_4$), or hydrogen chloride (HCl). Examples of suitable fluorine-containing gases include carbon tetrafluoride ($CF_4$), carbon hexafluoride ($C_2F_6$), sulfur hexafluoride ($SF_6$), trifluoromethane ($CHF_3$), and the like. In one embodiment, $CF_4$ is provided at a rate of between about 10-100 standard cubic centimeters per minute (sccm). Optionally, a carrier gas, such as helium (He) or argon (Ar) may be provided at a flow rate of between about 50-200 sccm. One specific process recipe provides $CF_4$ at a rate of about 50 sccm along with a carrier gas at a flow rate of about 100 sccm. The pressure in the process chamber is controlled to less than about 40 mtorr, and in one embodiment, between about 1 and about 10 mtorr, for example 2 mtorr.

A plasma is formed from the first process gas, for example, by applying RF power of between about 300 to about 600 W from a plasma power source to an antenna of the process chamber, as discussed below. It is contemplated that the plasma may be ignited by other methods. In one embodiment, RF power of about 420 W is applied at a frequency of about 13.56 MHz.

Optionally, a substrate bias power is applied to bias the mask 100. The bias power may be less than about 600 W, or in a first example, less than about 100 W, or in a second example, between 20 and about 150 W. One specific process recipe applies about 25 W of bias power. The bias power may further be an RF signal provided at a frequency of between about 1-20 MHz, or in one embodiment, 13.56 MHz.

The bias power may optionally be pulsed. The bias power may be pulsed in a duty cycle of between about 10-95 percent, or in one embodiment, between about 20-95 percent. In one embodiment, a biasing source is configured to provide less than about 600 Watts of RF power at a pulse frequency between about 1 to about 10 kHz, with a duty cycle between about 10 to about 95 percent. In another embodiment, the biasing source is configured to provide between about 20 to about 150 Watts of RF power at a pulse frequency between about 2 to about 5 kHz, with a duty cycle between about 20 to about 95 percent.

During processing, the cathode temperature may be maintained at a temperature of between approximately 15-30 degrees Celsius and the temperature of the chamber wall may be maintained at a temperature of between about 50-80 degrees Celsius. In one embodiment, the cathode temperature may be maintained at a temperature of approximately 20 degrees Celsius and the temperature of the chamber wall may be maintained at a temperature of about 65 degrees Celsius.

Figure 2C:
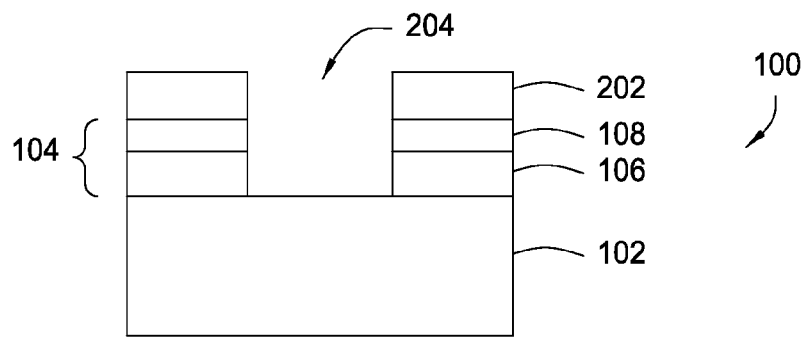

Next, at step 306, the bulk absorber layer 106 is etched in a second etch process using the self-mask layer 108 and remaining photoresist layer 202 as a mask, thereby transferring the pattern of the opening 204 to the bulk absorber layer 106 (as depicted in FIG. 2C), thereby exposing corresponding portions of the substrate 102. Optionally, the remaining photoresist layer 202 may be removed, or stripped, prior to performing step 306. The second etch process advantageously has a high selectivity of the bulk absorber layer 106 to the self-mask layer 108, thereby allowing the self-mask layer 108 to act as a hard mask for transferring the pattern (e.g., the opening 204) to the bulk absorber layer 106. The second etch process maintains a selectivity for the bulk absorber layer over the self-mask layer of at least 10. In one embodiment where the bulk absorber layer 106 comprises TaSi and where the second process gas comprises $Cl_2$ the etch selectivity for the bulk absorber layer 106 over the resist during is about 3.8 and the etch selectivity for the bulk absorber layer 106 over the self-mask layer 108 is about 15.

The second etch process etches the bulk absorber layer 106 by exposing the layer (through the opening 204) to species from a second process gas (or gas mixture) comprising at least one chlorine containing gas. Examples of suitable chlorine containing gases include chlorine ($Cl_2$), carbon $CCl_4$, HCl, and the like.

In one embodiment, the second process gas is provided at a rate of between about 10-200 standard cubic centimeters per minute (sccm). Optionally, a carrier gas, such as helium (He) or argon (Ar) may be provided at a flow rate of between about 50-200 sccm. One specific process recipe provides the second process gas at a rate of about 100 sccm along with a carrier gas at a rate of about 100 sccm. The pressure in the process chamber is controlled to less than about 40 mTorr, and in one embodiment, between about 1 and about 10 mTorr, for example 6 mTorr.

A plasma is formed from the second process gas, for example, by applying RF power of between about 300 to about 600 W from a plasma power source to an antenna of the process chamber, as discussed below. It is contemplated that the plasma may be ignited by other methods. In one embodiment, RF power of about 420 W is applied at a frequency of about 13.56 MHz.

Optionally, a substrate bias power is applied to bias the mask 100. The bias power may be less than about 600 W, or in a first example, less than about 100 W, or in a second example, between 20 and about 150 W. One specific process recipe applies about 20 W of bias power. The bias power may further be an RF signal provided at a frequency of between about 1-20 MHz, or in one embodiment, 13.56 MHz.

The bias power may optionally be pulsed. The bias power may be pulsed in a duty cycle of between about 10-95 percent, or in one embodiment, between about 20-95 percent. In one embodiment, the biasing source is configured to provide less than about 600 Watts of RF power at a pulse frequency between about 1 to about 10 kHz, with a duty cycle between about 10 to about 95 percent. In another embodiment, the biasing source is configured to provide between about 20 to about 150 Watts of RF power at a pulse frequency between about 2 to about 5 kHz, with a duty cycle between about 20 to about 95 percent.

During processing, the cathode temperature may be maintained at a temperature of between approximately 15-30 degrees Celsius and the temperature of the chamber wall may be maintained at a temperature of between about 50-80 degrees Celsius. In one embodiment, the cathode temperature may be maintained at a temperature of approximately 20 degrees Celsius and the temperature of the chamber wall may be maintained at a temperature of about 65 degrees Celsius.

Upon completion of step 306, the method 300 ends and the mask 100 now has the desired pattern transferred thereto. In alternate embodiments, such as in EAPSM or AAPSM applications, additional processing may continue to complete the mask as generally known in the art. For example, in an EAPSM mask, a multi-material layer (such as a molybdenum and silicon containing layer (sometimes referred to as a MoSi layer)) may be etched using a gas comprising $SF_6$ or $CF_4$ to complete the mask. Alternatively, in an AAPSM mask, the quartz substrate may be etched using a gas comprising $SF_6$ or $CF_4$ to complete the mask.

The method 300 advantageously provides a mask 100 having improved CD and uniformity as compared to conventional etch methods. For example, when the bulk absorber layer 106 is etched using the second etch process during step 306, the remaining photoresist 202 may be removed on corners of the opening 204, thereby exposing portions of the self-mask layer 108 to the chlorine gas plasma. However, due to the high selectivity of the bulk absorber layer 106 to the self-mask layer 108 in the chlorine plasma, the CD will not shrink significantly, even though the CD of the photoresist layer 202 may change. Thus, the final CD is mainly determined by the self-mask layer 108 etch during step 304, which, due to the relatively small thickness of the self-mask layer 108, advantageously will not contribute significantly to CD etch bias. In addition, as the local etch CD bias contributes to the etch CD uniformity, a low CD bias will further benefit the CD uniformity control. The method 300 may be advantageously utilized to provide masks having a reduced CD bias, for example, from about 0-10 nm (i.e., less than 10 nm).

The novel mask structure and etch method provided herein advantageously provide better control over etch CD bias and uniformity. The mask structure and method provides a "zero etch bias" with improved etch CD uniformity control using conventional materials and etch processes, i.e., without a technology challenge. Current strategy to control CD meanto-target (MTT) is mainly to use data sizing, which usually take several hours (sometimes even over 20 hours). The novel mask structure and etch method further advantageously eliminates the need for data sizing, thereby providing shorter delivery times, higher production yields, and lower cost of production as compared to conventional masks.

Figure 4:
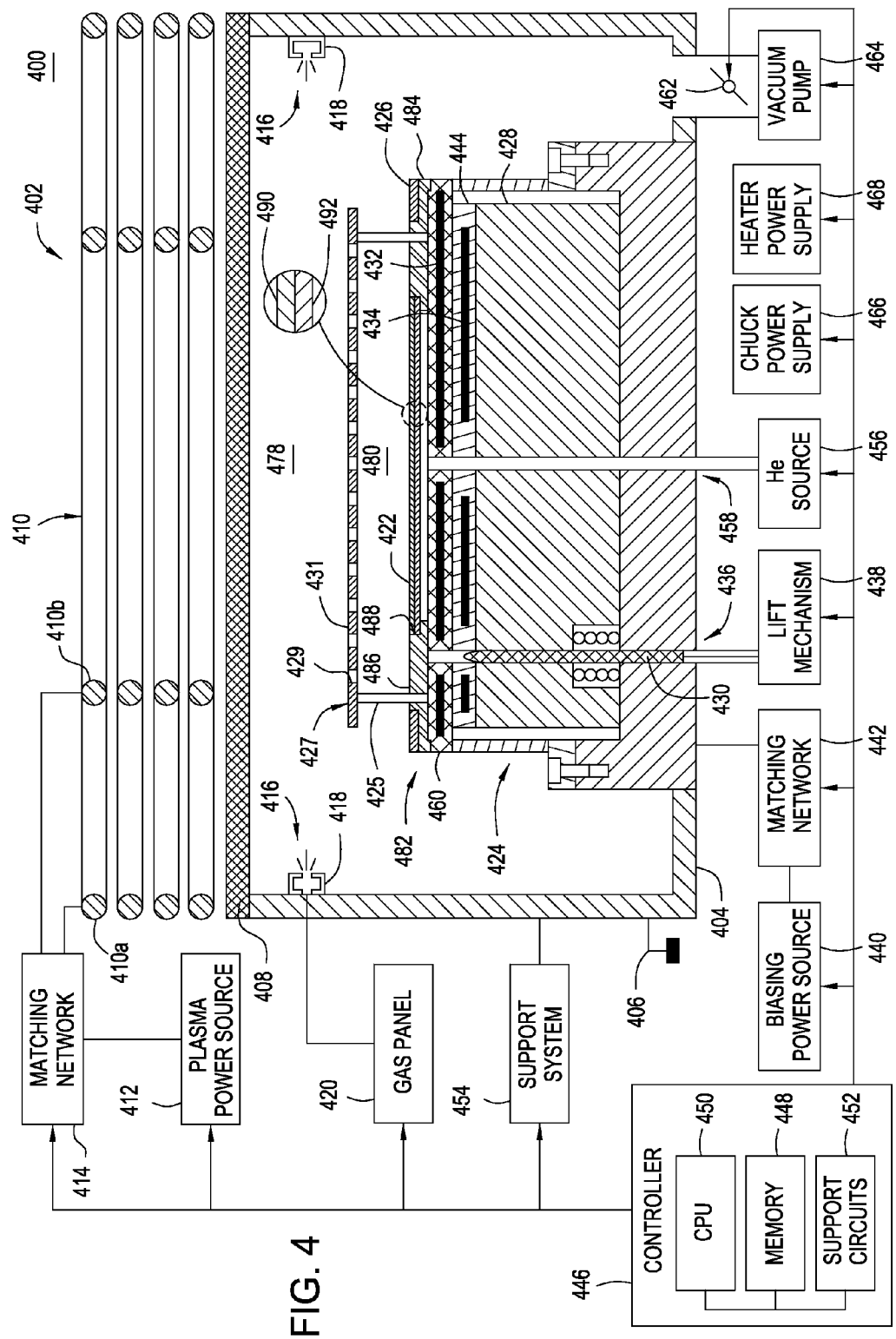
FIG. 4 is a schematic diagram of an etch reactor suitable for mask etching.

FIG. 4 depicts a schematic diagram of one embodiment of an etch reactor 400 in which methods of the present invention may be practiced. Suitable reactors that may be adapted for use with the teachings disclosed herein include, for example, the Decoupled Plasma Source (DPS®) II reactor, or the TETRA™ I and TETRA™ II Photomask etch systems, all of which are available from Applied Materials, Inc. of Santa Clara, Calif. The DPS® II reactor may also be used as a processing module of a CENTURA® integrated semiconductor wafer processing system, also available from Applied Materials, Inc. The particular embodiment of the reactor 400 shown herein is provided for illustrative purposes and should not be used to limit the scope of the invention.

The reactor 400 generally comprises a process chamber 402 having a substrate pedestal 424 within a conductive body (wall) 404, and a controller 446. The chamber 402 has a substantially flat dielectric ceiling 408. Other modifications of the chamber 402 may have other types of ceilings, e.g., a dome-shaped ceiling. An antenna 410 is disposed above the ceiling 408. The antenna 410 comprises one or more inductive coil elements that may be selectively controlled (two co-axial elements 410a and 410b are shown in FIG. 4). The antenna 410 is coupled through a first matching network 414 to a plasma power source 412. The plasma power source 412 is typically capable of producing up to about 3000 Watts (W) at a tunable frequency in a range from about 50 kHz to about 13.56 MHz. In one embodiment, the plasma power source 412 provides about 300 to about 600 W of inductively coupled RF power.

The substrate pedestal (cathode) 424 is coupled through a second matching network 442 to a biasing power source 440. The biasing source 440 provides between about zero to about 600 W at a tunable pulse frequency in the range of about 1 to about 10 kHz. The biasing source 440 produces pulsed RF power output. Alternatively, the biasing source 440 may produce pulsed DC power output. It is contemplated that the source 440 may also provide a constant power output.

In one embodiment, the biasing source 440 is configured to provide RF power less than about 600 Watts at a pulse frequency between about 1 to about 10 kHz, with a duty cycle between about 10 to about 95 percent. In another embodiment, the biasing source 440 is configured to provide RF power between about 20 to about 150 Watts, at a pulse frequency between about 2 to about 5 kHz, with a duty cycle between about 80 to about 95 percent.

In one embodiment, as in a DPS® II reactor, the substrate support pedestal 424 may include an electrostatic chuck 460. The electrostatic chuck 460 comprises at least one clamping electrode 432 and is controlled by a chuck power supply 466. In alternative embodiments, the substrate pedestal 424 may comprise substrate retention mechanisms such as a susceptor clamp ring, a mechanical chuck, and the like.

A gas panel 420 is coupled to the process chamber 402 to provide process and/or other gases to the interior of the process chamber 402. In the embodiment depicted in FIG. 4, the gas panel 420 is coupled to one or more inlets 416 formed in a channel 418 in the sidewall 404 of the chamber 402. It is contemplated that the one or more inlets 416 may be provided in other locations, for example, in the ceiling 408 of the process chamber 402.

In one embodiment, the gas panel 420 is adapted to selectively provide one or more process gases through the inlets 416 and into the interior of the process chamber 402 during processing. For example, in one embodiment, the gas panel 420 may be adapted to selectively provide a fluorine-containing and/or a chlorine-containing process gas (or gases) into the interior of the process chamber 402, as described below in connection with methods of etching a mask. During processing, a plasma is formed from the gas and maintained through inductive coupling of power from the plasma power source 412. The plasma may alternatively be formed remotely or ignited by other methods.

The pressure in the chamber 402 is controlled using a throttle valve 462 and a vacuum pump 464. The vacuum pump 464 and throttle valve 462 are capable of maintaining chamber pressures in the range of about 1 to about 20 mTorr.

The temperature of the wall 404 may be controlled using liquid-containing conduits (not shown) that run through the wall 404. Wall temperature is generally maintained at about 65 degrees Celsius. Typically, the chamber wall 404 is formed from a metal (e.g., aluminum, stainless steel, and the like) and is coupled to an electrical ground 406. The process chamber 402 also comprises conventional systems for process control, internal diagnostic, end point detection, and the like. Such systems are collectively shown as support systems 454.

A reticle adapter 482 may be used to secure a substrate (such as a reticle or other workpiece) 422 onto the substrate support pedestal 424. The substrate 422 may be a blank photomask comprising an optically transparent substrate 490 and a multi-layer absorber layer 492 disposed thereover (similar to the mask 100 including an optically transparent substrate 102 having a multi-layer absorber layer 104 described above with respect to FIG. 1.) The reticle adapter 482 generally includes a lower portion 484 milled to cover an upper surface of the pedestal 424 (for example, the electrostatic chuck 460) and a top portion 486 having an opening 488 that is sized and shaped to hold the substrate 422. The opening 488 is generally substantially centered with respect to the pedestal 424. The adapter 482 is generally formed from a single piece of etch resistant, high temperature resistant material such as polyimide ceramic or quartz. A suitable reticle adapter is disclosed in U.S. Pat. No. 6,251,217, issued on Jun. 26, 2001, and incorporated herein by reference. An edge ring 426 may cover and/or secure the adapter 482 to the pedestal 424.

A lift mechanism 438 is used to lower or raise the adapter 482, and hence, the substrate 422, onto or off of the substrate support pedestal 424. Generally, the lift mechanism 438 comprises a plurality of lift pins (one lift pin 430 is shown) that travel through respective guide holes 436.

In operation, the temperature of the substrate 422 is controlled by stabilizing the temperature of the substrate pedestal 424. In one embodiment, the substrate support pedestal 424 comprises a heater 444 and an optional heat sink 428. The heater 444 may be one or more fluid conduits configured to flow a heat transfer fluid therethrough. In another embodiment, the heater 444 may include at least one heating element 434 that is regulated by a heater power supply 468. Optionally, a backside gas (e.g., helium (He)) from a gas source 456 is provided via a gas conduit 458 to channels that are formed in the pedestal surface under the substrate 422. The backside gas is used to facilitate heat transfer between the pedestal 424 and the substrate 422. During processing, the pedestal 424 may be heated by the embedded heater 444 to a steady-state temperature, which in combination with the helium backside gas, facilitates uniform heating of the substrate 422.

Optionally, an ion-radical shield 427 may be disposed in the chamber body 402 above the pedestal 424. The ion-radical shield 427 is electrically isolated from the chamber walls 404 and the pedestal 424 and generally comprises a substantially flat plate 431 having a plurality of apertures 429. In the embodiment depicted in FIG. 4, the shield 427 is supported in the chamber 402 above the pedestal by a plurality of legs 425. The apertures 429 define a desired open area in the surface of the shield 427 that controls the quantity of ions that pass from a plasma formed in an upper process volume 478 of the process chamber 402 to a lower process volume 480 located between the ion-radical shield 427 and the substrate 422. The greater the open area, the more ions can pass through the ion-radical shield 427. As such, the size and distribution of the apertures 429, along with the thickness of the plate 431 controls the ion density in volume 480. Consequently, the shield 427 is an ion filter. One example of a suitable shield that may be adapted to benefit from the invention is described in U.S. patent application Ser. No. 10/882,084, filed Jun. 30, 2004 by Kumar, et al., and entitled "METHOD AND APPARATUS FOR PHOTOMASK PLASMA ETCHING," which is hereby incorporated by reference in its entirety.

The controller 446 comprises a central processing unit (CPU) 450, a memory 448, and support circuits 452 for the CPU 450 and facilitates control of the components of the process chamber 402 as, as such, of the etch process, as discussed above. The controller 446 may be one of any form of general-purpose computer processor that can be used in an industrial setting for controlling various chambers and sub-processors. The memory 448 of the controller 446 may be one or more of readily available memory such as random access memory (RAM), read only memory (ROM), floppy disk, hard disk, or any other form of digital storage, local or remote. The support circuits 452 are coupled to the CPU 450 for supporting the processor in a conventional manner. These circuits include cache, power supplies, clock circuits, input/output circuitry and subsystems, and the like. The inventive method is generally stored in the memory 448 or other computer-readable medium accessible to the CPU 450 as a software routine. Alternatively, such software routine may also be stored and/or executed by a second CPU (not shown) that is remotely located from the hardware being controlled by the CPU 450.

Thus, a photomask structure and method for etching has been provided herein that advantageously improves CD bias and uniformity attributes over conventional processes. Specifically, the mask and etch method disclosed herein provides for lower CD bias and greater uniformity as compared to conventional methods. The mask and etch methods may advantageously be used in optical binary photomask, embedded attenuated phase shift mask (EAPSM), and alternate aperture phase shift mask (AAPSM) applications to reduce the etch CD bias and improve pattern transfer fidelity as compared to conventional masks.

While the foregoing is directed to embodiments of the present invention, other and further embodiments of the invention may be devised without departing from the basic scope thereof, and the scope thereof is determined by the claims that follow.

The invention claimed is:

1. A photomask, comprising:
   a translucent substrate; and
   an opaque multi-layer absorber layer disposed over the substrate and comprising a self-mask layer disposed over a bulk absorber layer, the self-mask layer comprising one of oxidized and nitrogenized tantalum and silicon-based materials (TaSiON), tantalum boron oxide-based materials (TaBO), or oxidized and nitrogenized tantalum-based materials (TaON), wherein the bulk absorber layer is between about 80-85 percent of the thickness of the multi-layer absorber layer.

2. The photomask of claim 1, wherein the bulk absorber layer comprises one of tantalum silicide-based materials (TaSi), nitrogenized tantalum boride-based materials (TaBN), or tantalum nitride-based materials (TaN).

3. The photomask of claim 1, wherein the self-mask layer is between about 15-20 percent of the thickness of the multi-layer absorber layer.

4. The photomask of claim 1, wherein the thickness of the photomask is between 0.15-0.25 inch.

5. The photomask of claim 1, wherein the thickness of the opaque multi-layer absorber layer is between 40-100 nm.

6. The photomask of claim 1, wherein the self-mask layer comprises oxidized and nitrogenized tantalum and silicon-based materials (TaSiON) and the bulk absorber layer comprises tantalum silicide-based materials (TaSi).

7. The photomask of claim 1, wherein the self-mask layer comprises tantalum boron oxide-based materials (TaBO) and the bulk absorber layer comprises nitrogenized tantalum boride-based materials (TaBN).

8. The photomask of claim 1, wherein the self-mask layer comprises oxidized and nitrogenized tantalum-based materials (TaON) and the bulk absorber layer comprises tantalum nitride-based materials (TaN).

9. The photomask of claim 1, wherein the substrate comprises quartz.

10. A method of etching a photomask, comprising:
    providing a photomask comprising a transparent substrate having a multilayer absorber layer disposed thereover, the multilayer absorber layer comprising a self-mask layer disposed over a bulk absorber layer, wherein the self-mask layer comprises tantalum and oxygen and the bulk absorber layer comprises tantalum and essentially no oxygen; wherein the bulk absorber layer is between about 80-85 percent of the thickness of the multi-layer absorber layer;
    etching the self-mask layer using a first etch process; and
    etching the bulk absorber layer using a second etch process different than the first, wherein the etch rate of the bulk absorber layer is greater than the etch rate of the self-mask layer during the second etch process.

11. The method of claim 10, further comprising:
    depositing and patterning a photoresist layer atop the self-mask layer prior to etching the self-mask layer.

12. The method of claim 10, wherein the second etch process maintains a selectivity for the bulk absorber layer over the self-mask layer of at least 10.

13. The method of claim 10, wherein the self-mask layer comprises one of oxidized and nitrogenized tantalum and silicon-based materials (TaSiON), tantalum boron oxide-based materials (TaBO), or oxidized and nitrogenized tantalum-based materials (TaON).

14. The method of claim 10, wherein the bulk absorber layer comprises one of tantalum silicide-based materials (TaSi), nitrogenized tantalum boride-based materials (TaBN), or tantalum nitride-based materials (TaN).

15. The method of claim 10, wherein the self-mask layer comprises oxidized and nitrogenized tantalum and silicon-based materials (TaSiON) and the bulk-absorber layer comprises tantalum silicide-based materials (TaSi).

16. The method of claim 10, wherein the self-mask layer comprises tantalum boron oxide-based materials (TaBO) and the bulk absorber layer comprises nitrogenized tantalum boride-based materials (TaBN).

17. The method of claim 10, wherein the self-mask layer comprises oxidized and nitrogenized tantalum-based materials (TaON) and the bulk absorber layer comprises tantalum nitride-based materials (TaN).

18. The method of claim 10, wherein the first etch process comprises:
    etching the self-mask layer with a process gas comprising at least one of a fluorine containing gas, carbon tetrachloride ($CCl_4$), or hydrogen chloride (HCl).

19. The method of claim 10, wherein the first etch process comprises:
    etching the self-mask layer with a process gas comprising at least one of trifluoromethane ($CHF_3$), carbon tetrafluoride ($CF_4$), sulfur hexafluoride ($SF_6$), carbon hexafluoride ($C_2F_6$), carbon tetrachloride ($CCl_4$), or hydrogen chloride (HCl).

20. The method of claim 10, wherein the second etch process comprises:
    etching the bulk absorber layer with at least one chlorine containing process gas.

21. The method of claim 10, wherein the second etch process comprises:
etching the bulk absorber layer with a process gas comprising at least one of chlorine ($Cl_2$), carbon tetrachloride ($CCl_4$), or hydrogen chloride (HCl).

22. A method for creating an image on a blank photomask comprising a photoresist layer, an opaque layer underlying the photoresist layer having anti-reflective sub-layer and bulk sub-layer, wherein the bulk sub-layer is between about 80-85 percent of the thickness of the multi-layer absorber layer, and a substantially transparent substrate layer underlying the opaque layer, the method comprising:
creating a patterned image in the photoresist layer;
removing portions of the photoresist layer that do not correspond to the patterned image thereby exposing portions of the anti-reflective sub-layer of the opaque layer not corresponding to the patterned image;
removing the exposed portions of the anti-reflective sub-layer that do not correspond to the patterned image using a first etch process, thereby exposing portions of the bulk sub-layer not corresponding to the patterned image;
removing the exposed portions of the bulk sub-layer underlying the anti-reflective sub-layer that do not correspond to the patterned image using a second etch process having a bulk sub-layer removal rate that is at least 10 times greater than an anti-reflective sub-layer removal rate, thereby exposing portions of the substantially transparent layer that do not correspond to the patterned image; and
removing the photoresist layer.

23. The method of claim 22, wherein the anti-reflective sub-layer comprises one of oxidized and nitrogenized tantalum and silicon-based materials (TaSiON), tantalum boron oxide-based materials (TaBO), or oxidized and nitrogenized tantalum-based materials (TaON).

24. The method of claim 22, wherein the bulk sub-layer comprises one of tantalum silicide-based materials (TaSi), nitrogenized tantalum boride-based materials (TaBN), or tantalum nitride-based materials (TaN).

25. The method of claim 22, wherein removing the exposed portions of the anti-reflective sub-layer comprises:
etching the anti-reflective sub-layer with a process gas comprising at least one of a fluorine containing gas, carbon tetrachloride ($CCl_4$), or hydrogen chloride (HCl).

26. The method of claim 22, wherein the first etch process comprises:
etching the anti-reflective sub-layer with a process gas comprising at least one of trifluoromethane ($CHF_3$), carbon tetrafluoride ($CF_4$), sulfur hexafluoride ($SF_6$), carbon hexafluoride ($C_2F_6$), carbon tetrachloride ($CCl_4$), or hydrogen chloride (HCl).

27. The method of claim 22, wherein removing the exposed portions of the bulk sub-layer comprises:
etching the bulk sub-layer with a process gas comprising at least one chlorine containing gas.

28. The method of claim 22, wherein removing the exposed portions of the bulk sub-layer comprises:
etching the bulk sub-layer with a process gas comprising at least one of chlorine ($Cl_2$), carbon tetrachloride ($CCl_4$), or hydrogen chloride (HCl).

* * * * *